US011016289B2

(12) United States Patent
Nystrom (10) Patent No.: US 11,016,289 B2
(45) Date of Patent: May 25, 2021

(54) MICROMIRROR ACTUATOR ASSEMBLY

(71) Applicant: Microsoft Technology Licensing, LLC, Redmond, WA (US)

(72) Inventor: Michael James Nystrom, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 334 days.

(21) Appl. No.: 16/119,781

(22) Filed: Aug. 31, 2018

(65) Prior Publication Data

US 2020/0073113 A1    Mar. 5, 2020

(51) Int. Cl.
*G02B 26/08* (2006.01)
*G02B 26/10* (2006.01)
*H05K 1/14* (2006.01)

(52) U.S. Cl.
CPC ....... *G02B 26/0858* (2013.01); *G02B 26/101* (2013.01); *H05K 1/144* (2013.01); *H05K 2201/042* (2013.01); *H05K 2201/10083* (2013.01); *H05K 2201/10121* (2013.01); *H05K 2201/2036* (2013.01)

(58) Field of Classification Search
CPC .. G02B 26/0858; G02B 26/101; H05K 1/144; H05K 2201/042; H05K 2201/10083; H05K 2201/10121; H05K 2201/2036
USPC ...................................................... 359/200.8
See application file for complete search history.

(56) References Cited

U.S. PATENT DOCUMENTS

| | | |
|---|---|---|
| 6,708,492 B2 | 3/2004 | Sinclair |
| 7,854,524 B2 | 12/2010 | Garzon et al. |
| 8,649,079 B2 | 2/2014 | Naono |
| 9,707,579 B2 | 7/2017 | Winger |
| 2010/0195180 A1 | 8/2010 | Akanuma et al. |
| 2012/0160557 A1* | 6/2012 | Yamada ............. G02B 26/0858 174/544 |

FOREIGN PATENT DOCUMENTS

WO    2017039508 A1    3/2017

OTHER PUBLICATIONS

Fanya, et al., "A Large-Size MEMS Scanning Mirror for Speckle Reduction Application", In Journal of Micromachines, vols. 8, Issue 5, May 3, 2017, pp. 1-10.
Jain, et al., "An Electrothermally-Actuated, Dual-Mode Micromirror for Large Bi-Directional Scanning", In Proceedings of IEEE International Electron Devices Meeting, Dec. 13, 2004, 4 Pages.
Song, et al., "A review of micromirror arrays", In Journal of Precision Engineering, vol. 51, Jan. 2018, pp. 729-761.
"International Search Report and Written Opinion Issued in PCT Application No. PCT/US19/038798", dated Sep. 10, 2019, 12 Pages.

* cited by examiner

*Primary Examiner* — Euncha P Cherry (74) *Attorney, Agent, or Firm* — Alleman Hall Creasman & Tuttle LLP (57) ABSTRACT

A micromirror actuator assembly includes a lower printed circuit board (PCB), an upper PCB, and a frame spaced away from the lower PCB and spaced away from the upper PCB between the lower PCB and the upper PCB. A micromirror is rotatably attached to the frame. A plurality of piezoelectric actuators are affixed to the frame and configured to selectively deform the frame to scan the micromirror.

20 Claims, 5 Drawing Sheets

MICROMIRROR ACTUATOR ASSEMBLY

BACKGROUND

Micromirrors have a variety of applications in the fields of imaging, optics, and display. Micromirror arrays are often used in televisions, head-mounted displays, digital cameras, scanners, projectors, etc. During typical operation of a micromirror array, one or more actuators cause tilting of a micromirror to selectively redirect light through a desired path.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A micromirror actuator assembly includes a lower printed circuit board (PCB), an upper PCB, and a frame spaced away from the lower PCB and spaced away from the upper PCB between the lower PCB and the upper PCB. A micromirror is rotatably attached to the frame. A plurality of piezoelectric actuators are affixed to the frame and configured to selectively deform the frame to scan the micromirror.

DETAILED DESCRIPTION

In devices with moving components, it is often a challenge to prevent such movement from adversely affecting any surrounding non-moving components. For instance, when not properly controlled, kinetic energy propagating through a device can put strain on ribbon connectors, weaken adhesive attachments, damage printed circuit boards (PCBs), etc. With specific regard to micromirror actuator assemblies, desired movement of the micromirror may be induced via selective bending of a flexible frame that supports the micromirror. However, this bending is not always confined to the flexible frame. For example, supporting structures attached to the flexible frame, such as a PCB that supplies power to the actuators, may flex or deform during scanning. This can weaken or dislodge the attachments between the frame and PCB, produce audible noise, damage the PCB itself, and/or adversely affect precise control of the micromirror.

Possible solutions to these and related problems include making the PCB thicker and therefore more rigid and/or constructing the PCB from a less flexible material. However, this can increase the cost of the device and/or be insufficient to provide a desired level of micromirror control. Additionally or alternatively, as will be described in further detail below, additional supporting elements may be added to the micromirror actuator assembly to reduce deformation of the PCB during scanning of the micromirror. For instance, an additional PCB may be added to the micromirror actuator assembly above the micromirror, such that the micromirror is sandwiched between a lower PCB and an upper PCB. Optionally, either or both of the upper and lower PCBs may be thinner than an equally-rigid PCB in a single PCB micromirror actuator assembly.

The supporting element used to provide additional rigidity optionally may be an upper PCB. However, as will be described in more detail below, other structural elements may be used as an alternative to the upper PCB, while still being positioned above the micromirror and used to reduce deformation of the lower PCB during scanning. For example, as an alternative to the upper PCB, a deformation-resistant supporting cover may be used, as will be described below with respect to FIG. 5.

Figure 1:
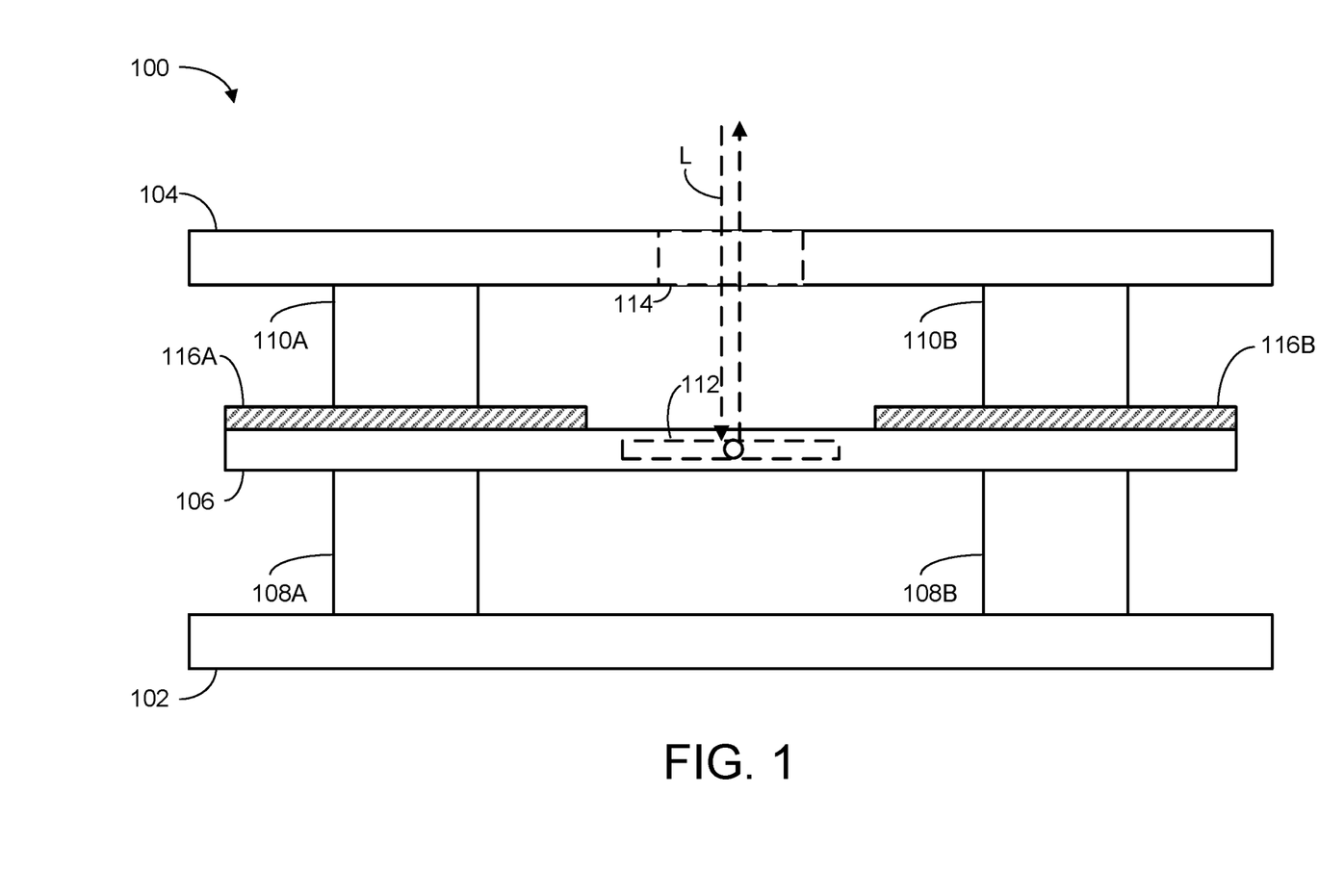
FIG. 1 schematically shows an example micromirror actuator assembly.

FIG. 1 schematically shows an example micromirror actuator assembly 100. Components in FIG. 1 are not drawn to scale, and the exact structure of micromirror actuator assembly 100 is not limiting. For example, various components of micromirror actuator assembly 100 may be modified or omitted, and/or additional components may be added, without departing from the scope of this disclosure.

Micromirror actuator assembly 100 includes a lower PCB 102, an upper PCB 104, and a frame 106. In some examples, each of the upper PCB, lower PCB, and frame may have a thickness of 500 microns, although any suitable dimensions may be used, and the upper PCB, lower PCB, and frame need not each have the same thickness. Each of lower PCB 102, upper PCB 104, and frame 106 may be constructed from any suitable materials, including metals, plastics, ceramics, composites, etc. One or both of lower PCB 102 and upper PCB 104 may include FR-4, a glass-reinforced epoxy laminate material. Additional or alternative materials may include FR-1, CEM-1, CEM-3, G-10, polytetrafluoroethylene, etc. Frame 106 may optionally include a metal alloy that is expansion-matched to silicon, particularly when the micromirror is constructed partially or entirely from silicon. One example of such a metal alloy is alloy 42, a nickel and iron alloy comprising 42% nickel.

Frame 106 is spaced away from the lower PCB and upper PCBs and positioned between the lower and upper PCBs. Frame 106 is attached to lower PCB 102 via lower spacers 108A and 108B. Similarly, frame 106 is attached to upper PCB 104 via upper spacers 110A and 110B. In some examples, the frame may be spaced approximately 200 microns from each of the upper and lower PCBs, although any suitable spacing may be used, and the spacing need not be the same for each of the upper and lower PCBs. Furthermore, any suitable number of upper and/or lower spacers may be used. For instance, the micromirror actuator assembly may include only one upper/lower spacer, or more than two upper/lower spacers. The upper and lower spacers may be separate pieces of material, or each spacer may be a continuous piece that spans between the upper and lower PCBs and passes through the frame. Furthermore, in some examples, the upper and lower spacers may be formed from a same piece of material as the frame.

Micromirror actuator assembly 100 also includes a micromirror 112 rotatably attached to the frame. As used herein, "micromirror" refers to the overall structure attached to the frame. In other words, though at least a portion of the micromirror will typically be reflective, the term "micromirror" refers to the larger structure, which may include less-reflective portions. Similarly, at least some part of the micromirror will move or tilt as the frame is deformed, though some portions of the micromirror may remain stationary during scanning. In FIG. 1, micromirror 112 is occluded by frame 106, and is therefore shown with dashed lines to indicate the position of the micromirror.

Micromirror 112 may be constructed from any suitable materials. For example, micromirror 112 may include silicon, plastics, metals, ceramics, etc. Micromirror 112 may be constructed from a material that is naturally reflective, polished to achieve reflectivity, and/or a reflective coating may be applied to at least a portion of the micromirror. Furthermore, the micromirror may be affixed to the frame in any suitable way, for example using solder or adhesive. In some implementations, the micromirror may be made from the same material as the frame.

Upper PCB 104 defines a light-admitting aperture 114. Light-admitting aperture 114 is shown in dashed lines to indicate that upper PCB 104 is shown in cross-section, and light-admitting aperture 114 would not be visible when micromirror actuator assembly 100 is viewed from the depicted angle. A light ray L passes through the light-admitting aperture and is redirected by micromirror 112 back through the light-admitting aperture. During scanning of the micromirror, the light ray may be selectively redirected to follow a desired light path, as will be discussed in more detail below.

The light-admitting aperture may take any suitable form. For example, the light-admitting aperture may be a hole or void defined by the upper PCB. Alternatively, the light-admitting aperture may be a portion of the upper PCB that is constructed from a transparent material. The light-admitting aperture may have any suitable shape and size. In some configurations, the light-admitting aperture optionally may be surrounded on all sides by upper PCB material. In other configurations, the light-admitting aperture is not surrounded on all sides by upper PCB material, and is instead defined by a notch or cutout edge of the upper PCB (e.g., the PCB may be U-shaped around the light-admitting aperture).

Scanning of the micromirror may be achieved via selective actuation of a plurality of piezoelectric actuators. Thus, a micromirror actuator assembly may include a plurality of piezoelectric actuators affixed to the frame and configured to selectively deform the frame to scan the micromirror. In the specific example of FIG. 1, micromirror actuator assembly 100 includes four piezoelectric actuators, two of which are shown in FIG. 1 as piezoelectric actuators 116A and 116B. In general, however, a micromirror actuator assembly may include any suitable number of piezoelectric actuators.

In some examples, the piezoelectric actuators include lead zirconate titanate (PZT), a ceramic material that exhibits a strong piezoelectric effect. More specifically, the piezoelectric actuators may include the 5 H variant of PZT (commonly denoted as PZT-5H), although any suitable piezoelectric materials may be used. Furthermore, the piezoelectric actuators may have any shape and dimensions. In some examples, the piezoelectric actuators may have a thickness of 125 microns.

Figure 2:
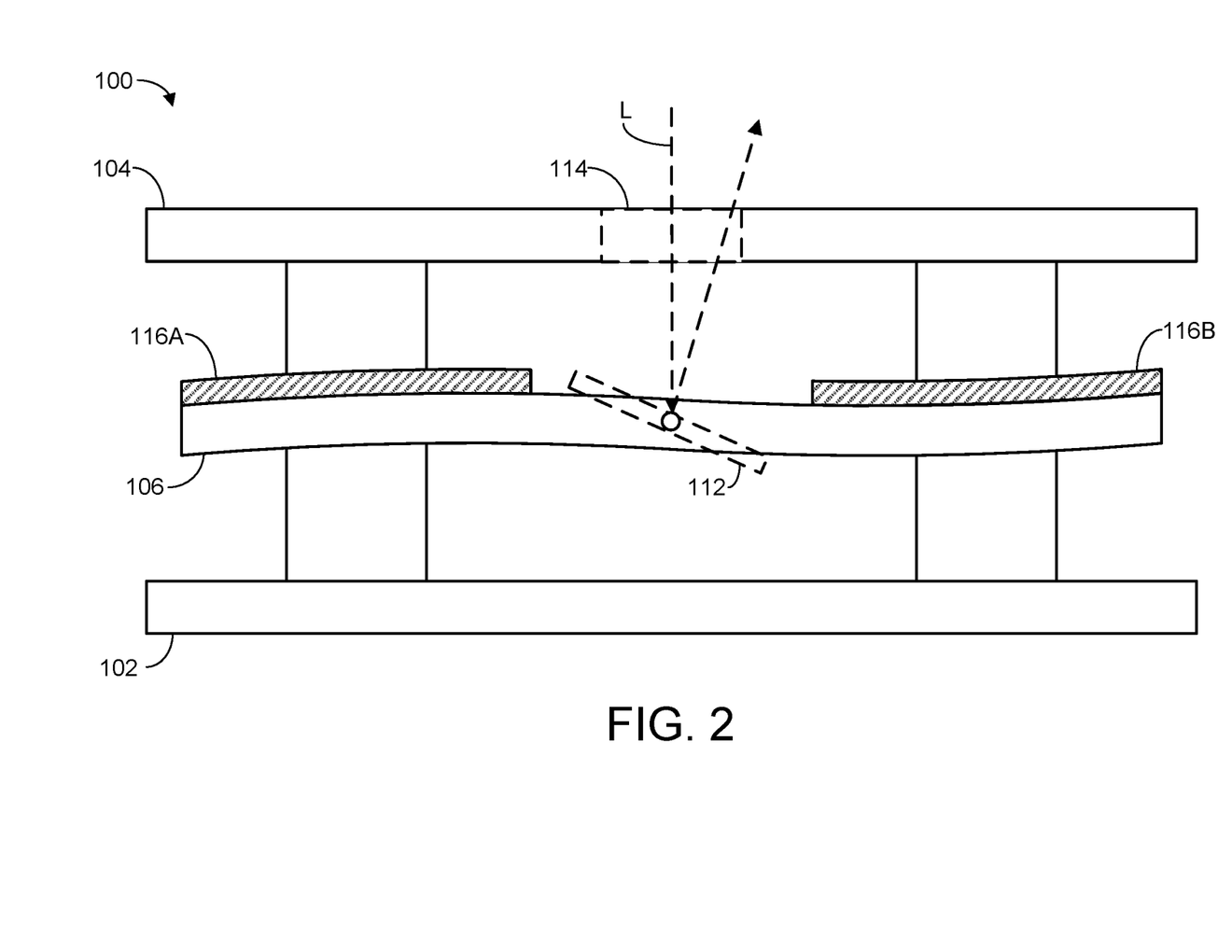
FIG. 2 illustrates scanning of a micromirror via deformation of a frame.

Scanning of the micromirror is schematically illustrated in FIG. 2, which again shows micromirror actuator assembly 100. In this example, however, piezoelectric actuators 116A and 116B are being actuated and are deforming frame 106. This may be done, for example, by applying an electrical voltage to the piezoelectric actuators, causing their shapes to change via the piezoelectric effect. In the illustrated example, piezoelectric actuators 116A and 116B are actuated in opposite directions—i.e., actuator 116A bends the frame upwards, while actuator 116B bends the frame downwards. Deformation of the frame causes the micromirror to tilt, as is shown in FIG. 2, where micromirror 112 is tilted at a greater angle than is shown in FIG. 1. Correspondingly, light ray L is redirected through light-admitting aperture 114 at a greater angle than is shown in FIG. 1. Thus, selective actuation of the piezoelectric actuators can be used to scan the micromirror and selectively redirect the light ray.

Furthermore, reversal of the electrical signal applied to the actuators may cause the frame to bend in the opposite direction, and therefore cause the mirror to tilt in the opposite direction. For example, if the electrical signal supplied to piezoelectric actuators 116A and 116B is reversed, then actuator 116A may bend the frame downwards, while actuator 116B bends the frame upwards. This may cause the micromirror to tilt in the opposite direction from what is shown in FIG. 2. If the frequency of the change in the electrical current is matched to the resonance frequency of the micromirror, the angle of the mirror tilt can be increased compared to non-resonant frequencies.

However, in single-PCB applications the deformation of the frame may not be confined to only the frame. Rather, actuation of the piezoelectric actuators may cause corresponding bending of the spacers and/or lower PCB, which can weaken adhesive attachments, produce audible noise, decrease micromirror control, and/or damage components of the assembly. Accordingly, in micromirror actuator assembly 100, the upper PCB is affixed to the lower PCB such that the upper PCB braces the lower PCB to reduce deformation of the lower PCB during scanning of the micromirror. In other words, addition of the upper PCB to the micromirror actuator assembly has the effect of stiffening the overall structure. As a result, deformation of the lower PCB during scanning of the micromirror is at least partially reduced. Notably, the upper PCB need not directly contact the lower PCB for the upper PCB to be "affixed" to the lower PCB. Rather, any number of intermediate structures (e.g., spacers and/or frame) may be disposed between the upper and lower PCBs.

A thickness of each of the upper and lower PCBs, and/or a spacing between the frame and upper/lower PCBs, may be set to reduce an overall size/cost of the micromirror actuator assembly. For example, if a PCB in a single-PCB micromirror actuator assembly has a thickness of 1 mm, then each of the upper and lower PCBs of an improved dual-PCB micromirror actuator assembly may have a thickness of 0.5 mm (500 microns) or less. In this manner, the upper PCB may be incorporated into the micromirror actuator assembly, thereby providing the increased stiffness and deformation resistance discussed above, without significantly increasing the size and/or weight of the assembly. However, each of the upper and lower PCBs may have any suitable dimensions and need not each have the same thickness.

In single-PCB micromirror actuator assemblies, the various circuits and signal lines associated with operation of the micromirror may be integrated into the single PCB. However, when both upper and lower PCBs are used, such circuitry may be integrated into either or both of the upper and lower PCBs. Additionally, or alternatively, either or both of the upper and lower PCBs may be used to house circuitry unrelated to operation of the micromirror (e.g., circuitry associated with operation of other components of a larger device), or include no circuitry at all. The upper PCB may also provide the added benefit of protecting the sensitive micromirror and frame during handling and assembly.

Figure 3:
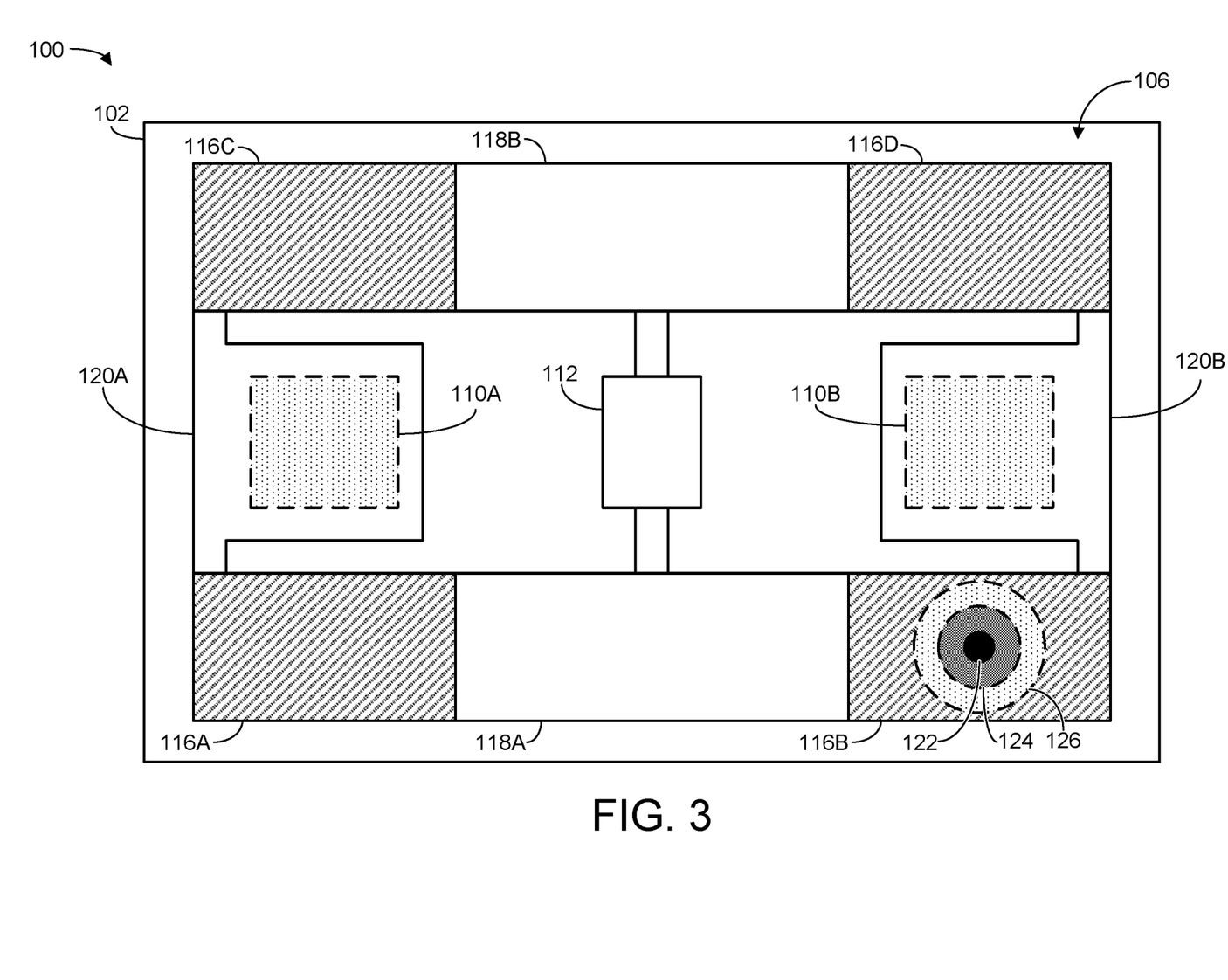
FIG. 3 schematically shows a plan view of the example micromirror actuator assembly of FIG. 1.

FIG. 3 schematically shows a plan view of micromirror actuator assembly 100 with upper PCB removed. As with FIG. 1, components in FIG. 3 are not drawn to scale, and the exact structure of micromirror actuator assembly 100 is not limiting. For example, various components of micromirror actuator assembly 100 may be modified or omitted, and/or additional components may be added, without departing from the scope of this disclosure.

As can be seen in FIG. 3, frame 106 of micromirror actuator assembly 100 includes first and second mirror-supporting sides 118A and 118B, as well as first and second frame-supporting sides 120A and 120B extending between the first and second mirror-supporting sides. Furthermore, micromirror 112 is attached to each of the first and second mirror-supporting sides and extends between the first and second mirror-supporting sides. Micromirror actuator assembly 100 includes four piezoelectric actuators, including actuators 116A and 116B described above with respect to FIGS. 1 and 2, as well as actuators 116C and 116D visible in FIG. 3. Each of the four piezoelectric actuators is positioned at a different corner of the frame and attached to the first and second mirror-supporting sides of the frame.

In FIG. 3, a portion of piezoelectric actuator 116B has been cut away, revealing the interface between actuator 116B and frame 106. As shown, piezoelectric actuator 116B includes an electrode 122. In general, each of the piezoelectric actuators may include at least one electrode—e.g., one or more electrodes on the bottom surface of each actuator and/or one or more electrodes on the top surface of each actuator. To provide an electrical path between frame 106 and piezoelectric actuator 116B, the actuator is affixed to the frame with conductive adhesive 124. Any suitable electrically-conductive adhesive may be used. Additionally, or alternatively, one or more piezoelectric actuators may be soldered to the frame.

Piezoelectric actuator 116B optionally may be affixed to frame 106 using a non-conductive adhesive 126, which serves to insulate the electrical path between the actuator and frame. For example, the non-conductive adhesive 126 may surround the conductive adhesive, thus confining the conductive signal path to the conductive adhesive 126. When included, any suitable electrically-nonconductive adhesive may be used. However, electrically-nonconductive adhesive need not be used in all implementations. In general, the piezoelectric actuators may be affixed to the frame in any suitable manner.

Electrical conduction between the piezoelectric actuators and either or both of the upper and lower PCBs may be established in a variety of ways. For instance, the frame and/or spacers may be constructed from electrically-conductive materials, and/or include one or more electrodes, electrical traces, etc., such that an electrical path is established between either or both of the upper and lower PCBs and each individual piezoelectric actuator. In cases where the frame and spacers are physically separate, the frame and spacers may be affixed using conductive adhesive. Similarly, each of the spacers may be affixed to the upper/lower PCBs using conductive adhesive, and/or another suitable adhesive that enables electrical conductivity between the PCB(s) and piezoelectric actuators.

FIG. 3 shows upper spacers 110A and 110B in dashed lines. In this example, the lower spacers and upper spacers are each formed from separate pieces of material from each other and from frame 106. In other words, each of the lower spacers and each of the upper spacers may be separate pieces and attached to the upper/lower PCBs and frame in any suitable manner. Each of the upper and lower spacers may be constructed from any suitable materials, including metals, plastics, ceramics, composites, etc. The upper and lower spacers may optionally be made from a same material as the frame.

However, a variety of different spacer arrangements and configurations are possible. For instance, the upper and lower spacers need not be separate from one another. Rather, the upper and lower spacers may take the form of continuous columns that extend through the frame and between the upper and lower PCBs. Adhesive, solder, heat staking, mechanical joints, and/or other suitable techniques may be used to affix the frame around each spacer column. As another possibility, the one or more lower spacers and the first and second frame-supporting sides may be formed from a single piece of material. Thus, the one or more lower spacers may be implemented as tabs or similar structures that bend from the first and second frame-supporting sides to the lower PCB. Similarly, the one or more upper spacers may be formed from a single piece of material with the first and second frame-supporting sides and bend upward to the upper PCB.

Figure 4:
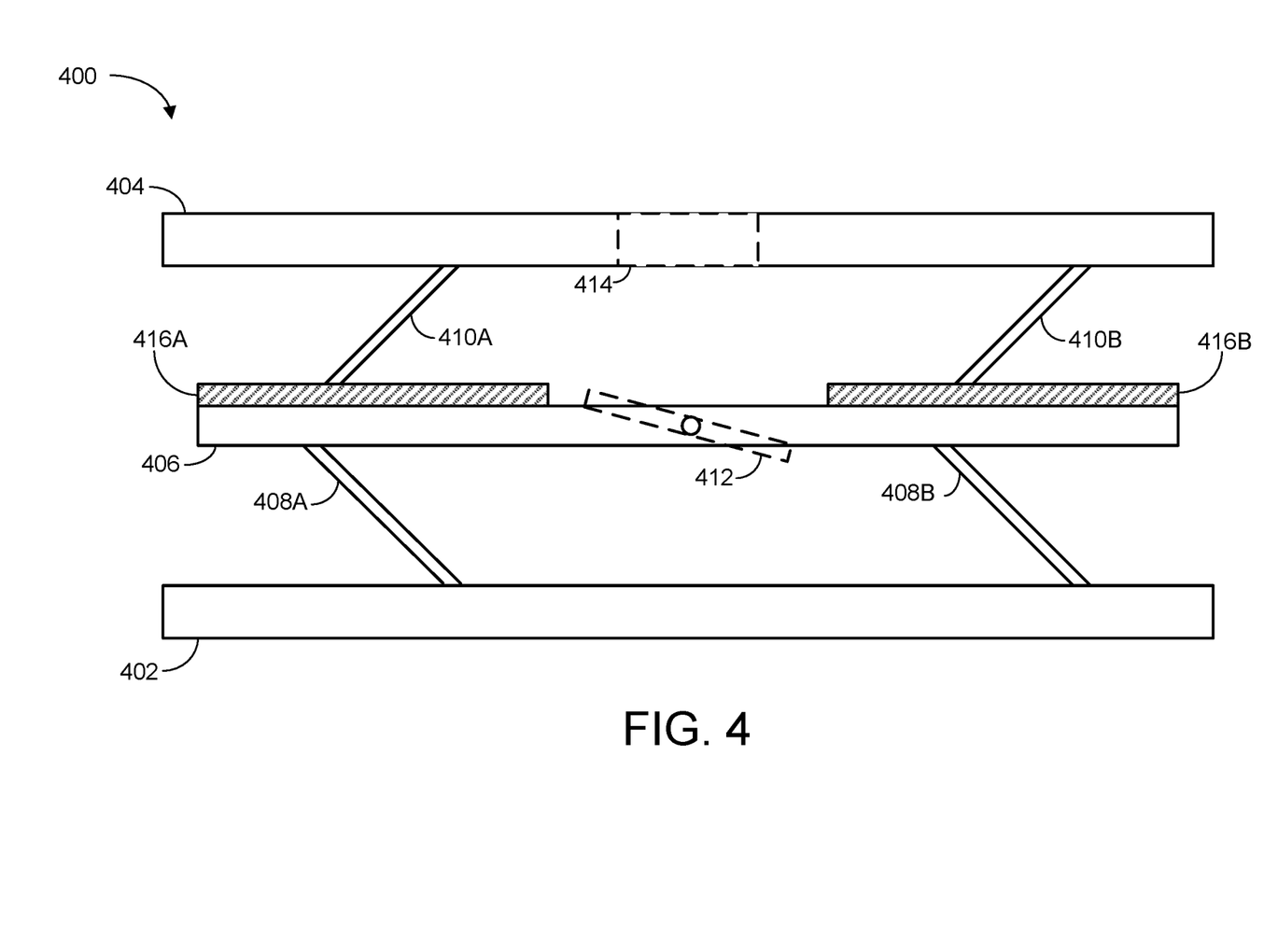
FIG. 4 schematically shows another example micromirror actuator assembly.

This is illustrated in FIG. 4, which schematically shows another example micromirror actuator assembly 400. As with FIG. 1, components in FIG. 4 are not drawn to scale, and the exact structure of micromirror actuator assembly 400 is not limiting. For example, various components of micromirror actuator assembly 400 may be modified or omitted, and/or additional components may be added, without departing from the scope of this disclosure.

As with micromirror actuator assembly 100, assembly 400 includes a lower PCB 402, upper PCB 404, and frame 406. Frame 406 is spaced away from the lower PCB via lower spacers 408A and 408B and spaced away from upper PCB 404 via upper spacers 410A and 410B. Micromirror actuator assembly 400 also includes a micromirror 412, light-admitting aperture 414, and at least two piezoelectric actuators 416A and 416B.

However, unlike micromirror actuator assembly 100, lower spacers 408A and 408B, as well as upper spacers 410A and 410B, are formed from the same piece of material as frame 406. The upper and lower spacers bend away from the frame and attach to the upper PCB and lower PCB respectively. This can help to simplify construction of the micromirror actuator assembly by limiting the number of individual pieces that must be assembled. However, as discussed above, the specific spacer arrangement shown in FIG. 4 is not limiting. For example, an alternative micromirror actuator may feature a different suitable arrangement of spacers, and may include multiple types of spacers (e.g., independent upper/lower spacers, discrete columns, tabs bending away from the frame), in the same assembly. The angles at which the upper/lower spacers are bent, as well as the directions in which the upper/lower spacers are bent, are not limiting.

Figure 5:
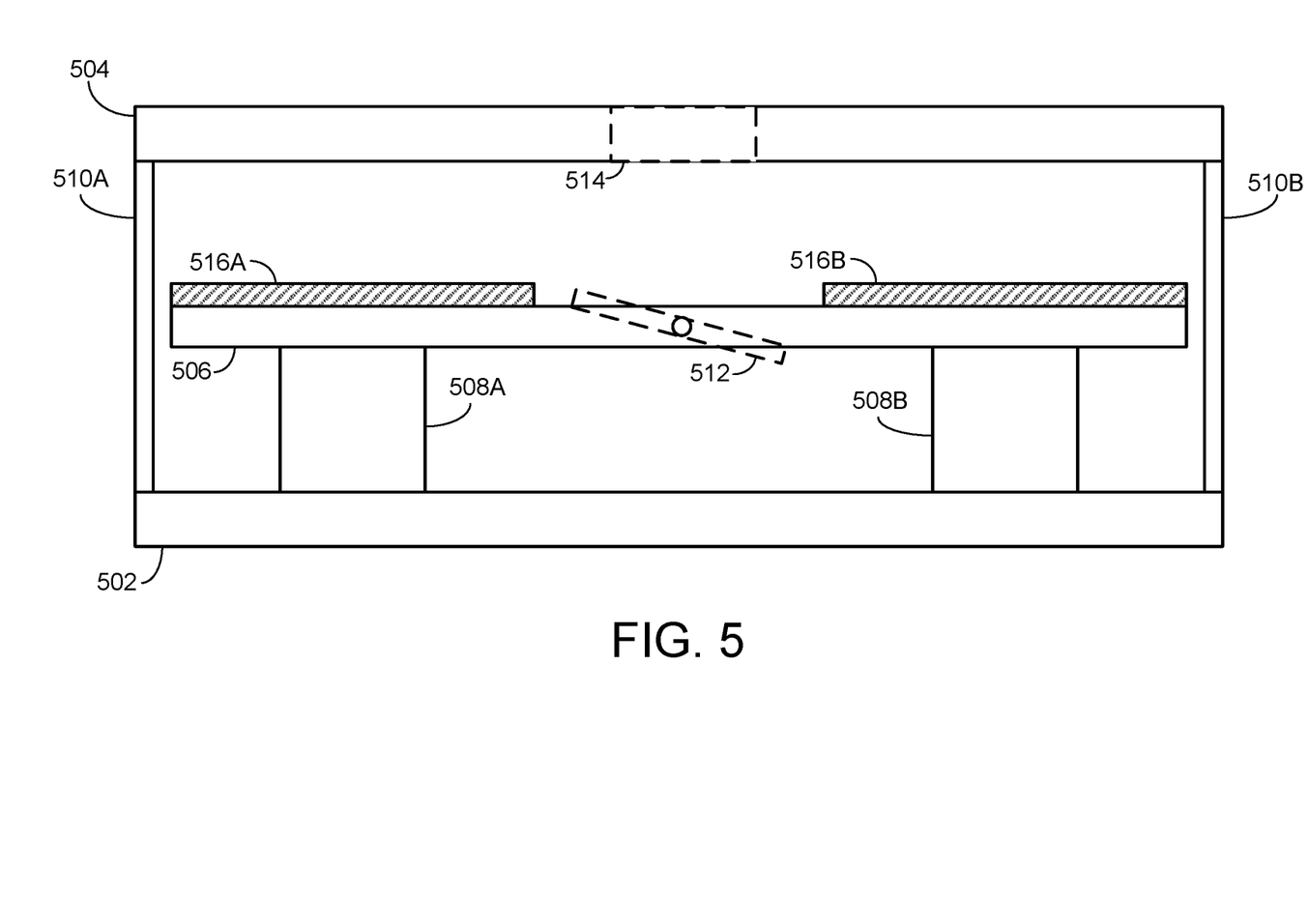
FIG. 5 schematically shows another example micromirror actuator assembly.

Furthermore, as discussed above, reduction of lower PCB deformation during scanning of the micromirror may be achieved without an upper PCB. Rather, a different suitable structure, such as a deformation-resistant supporting cover, may be disposed above the micromirror and serve to reduce deformation of the lower PCB. This is illustrated in FIG. 5, which schematically shows another example micromirror actuator assembly 500. As with FIG. 1, components in FIG. 5 are not drawn to scale, and the exact structure of micromirror actuator assembly 500 is not limiting. For example, various components of micromirror actuator assembly 500 may be modified or omitted, and/or additional components may be added, without departing from the scope of this disclosure.

Micromirror actuator assembly 500 includes a lower PCB 502. However, as an alternative to an upper PCB, micromirror actuator assembly 500 includes a deformation-resistant supporting cover 504. The supporting cover may take any suitable form and have any suitable size and shape. In some examples, the deformation-resistant supporting cover may be made from a PCB material (e.g., FR-4) though lack circuitry/electrical traces, although any suitable material may be used, including metals, plastics, ceramics, composites, etc.

Micromirror actuator assembly 500 also includes a frame 506 spaced away from the lower PCB and deformation-resistant supporting cover. Frame 506 is spaced away from lower PCB 502 by way of frame spacers 508A and 508B. Furthermore, deformation-resistant supporting cover 504 is spaced away from the lower PCB and frame by way of cover spacers 510A and 510B. Unlike the upper spacers of micromirror actuator assemblies 100 and 400, cover spacers 510A and 510B span between the lower PCB and supporting cover without contacting frame 506. Cover spacers 510A and 510B may be affixed to the lower PCB and supporting cover in any suitable way, for instance using adhesives, solder, heat staking, etc.

Use of cover spacers 510A and 510B is not exclusive to embodiments in which a deformation-resistant supporting cover is used in lieu of an upper PCB. In other words, similar spacers to cover spacers 510A and 510B may be used in micromirror actuator assemblies featuring an upper PCB, either in addition to or as an alternative to the upper and lower spacers described above. Similarly, upper and lower spacers may be used in embodiments featuring deformation-resistant supporting covers instead of upper PCBs, either in addition to or as an alternative to cover spacers.

Micromirror actuator assembly 500 also includes a micromirror 512, light-admitting aperture 514, and at least two piezoelectric actuators 516A and 516B. Such components may function substantially the same as described above with respect to micromirror actuator assemblies 100 and 400. Although, as discussed above, the specific configuration shown in FIG. 5 is not limiting, and numerous alterations to micromirror 512, light-admitting aperture 514, piezoelectric actuators 516A and 516B, and/or other components of micromirror actuator assembly 500, are within the scope of this disclosure.

In an example, a micromirror actuator assembly comprises: a lower printed circuit board (PCB); an upper PCB; a frame spaced away from the lower PCB and spaced away from the upper PCB between the lower PCB and the upper PCB; a micromirror rotatably attached to the frame; and a plurality of piezoelectric actuators affixed to the frame and configured to selectively deform the frame to scan the micromirror. In this example or any other example, the upper PCB is affixed to the lower PCB such that the upper PCB reduces deformation of the lower PCB during scanning of the micromirror. In this example or any other example, the upper PCB defines a light-admitting aperture. In this example or any other example, light passing through the light-admitting aperture is selectively redirected by the micromirror back through the light-admitting aperture during scanning of the micromirror. In this example or any other example, the frame comprises first and second mirror-supporting sides and first and second frame-supporting sides extending between the first and second mirror-supporting sides. In this example or any other example, the micromirror is attached to each of the first and second mirror-supporting sides and extends between the first and second mirror-supporting sides. In this example or any other example, the assembly further comprises one or more lower spacers between the frame and the lower PCB and one or more upper spacers between the frame and the upper PCB. In this example or any other example, the one or more lower spacers and the one or more upper spacers are separate pieces of material. In this example or any other example, the one or more lower spacers and the first and second frame-supporting sides are formed from a single piece of material, and the one or more lower spacers bend from the first and second frame-supporting sides to the lower PCB. In this example or any other example, the one or more lower spacers are affixed to the lower PCB using conductive adhesive to enable electrical conduction between the lower PCB and the frame. In this example or any other example, the plurality of piezoelectric actuators includes four piezoelectric actuators each positioned at a different corner of the frame and attached to the first and second mirror-supporting sides of the frame. In this example or any other example, a piezoelectric actuator of the plurality of piezoelectric actuators includes at least one electrode, and the piezoelectric actuator is affixed to the frame using a conductive adhesive providing an electrical path between the frame and the piezoelectric actuator. In this example or any other example, the assembly further comprises a non-conductive adhesive around the conductive adhesive to further affix the piezoelectric actuator to the frame and insulate the electrical path. In this example or any other example, the lower PCB and the upper PCB include FR-4. In this example or any other example, the frame includes a metal alloy that is expansion-matched to silicon. In this example or any other example, the metal alloy is alloy 42. In this example or any other example, the micromirror includes silicon. In this example or any other example, each of the plurality of piezoelectric actuators include lead zirconate titanate (PZT).

In an example, a micromirror actuator assembly comprises: a lower printed circuit board (PCB); an upper deformation-resistant supporting cover; a frame spaced away from the lower PCB and spaced away from the upper deformation-resistant supporting cover between the lower PCB and the upper deformation-resistant supporting cover; a micromirror rotatably attached to the frame; and a plurality of piezoelectric actuators affixed to the frame and configured to selectively deform the frame to scan the micromirror.

In an example, a micromirror resonance actuator assembly comprises: a lower printed circuit board (PCB); an upper deformation-resistant supporting cover including a light-admitting aperture; a frame spaced away from the lower PCB and spaced away from the upper deformation-resistant supporting cover between the lower PCB and the upper deformation-resistant supporting cover; a micromirror rotatably attached to the frame; and a plurality of piezoelectric actuators affixed to the frame and configured to selectively deform the frame to scan the micromirror, such that light passing through the light-admitting aperture is selectively redirected by the micromirror back through the light-admitting aperture during scanning of the micromirror.

It will be understood that the configurations and/or approaches described herein are exemplary in nature, and that these specific embodiments or examples are not to be considered in a limiting sense, because numerous variations are possible. Use of the terms "upper" and "lower" are not intended to imply any particular orientation relative to gravity, but instead are intended to generically distinguish between opposite sides of the frame, regardless of how the frame is orientated relative to gravity.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A micromirror actuator assembly, comprising:
    a lower printed circuit board (PCB);
    an upper PCB;
    a frame spaced away from the lower PCB and spaced away from the upper PCB between the lower PCB and the upper PCB;
    one or more lower spacers extending between the frame and the lower PCB and spacing the lower PCB away from the frame;
    a micromirror rotatably attached to the frame; and
    a plurality of piezoelectric actuators affixed to the frame and configured to selectively deform the frame to scan the micromirror.

2. The micromirror actuator assembly of claim 1, where the upper PCB is affixed to the lower PCB such that the upper PCB reduces deformation of the lower PCB during scanning of the micromirror.

3. The micromirror actuator assembly of claim 1, where the upper PCB defines a light-admitting aperture.

4. The micromirror actuator assembly of claim 3, where light passing through the light-admitting aperture is selectively redirected by the micromirror back through the light-admitting aperture during scanning of the micromirror.

5. The micromirror actuator assembly of claim 1, where the frame comprises first and second mirror-supporting sides and first and second frame-supporting sides extending between the first and second mirror-supporting sides.

6. The micromirror actuator assembly of claim 5, where the micromirror is attached to each of the first and second mirror-supporting sides and extends between the first and second mirror-supporting sides.

7. The micromirror actuator assembly of claim 5, further comprising one or more upper spacers between the frame and the upper PCB.

8. The micromirror actuator assembly of claim 7, where the one or more lower spacers and the one or more upper spacers are separate pieces of material.

9. The micromirror actuator assembly of claim 7, where the one or more lower spacers and the first and second frame-supporting sides are formed from a single piece of material, and where the one or more lower spacers bend from the first and second frame-supporting sides to the lower PCB.

10. The micromirror actuator assembly of claim 7, where the one or more lower spacers are affixed to the lower PCB using conductive adhesive to enable electrical conduction between the lower PCB and the frame.

11. The micromirror actuator assembly of claim 5, where the plurality of piezoelectric actuators includes four piezoelectric actuators each positioned at a different corner of the frame and attached to the first and second mirror-supporting sides of the frame.

12. The micromirror actuator assembly of claim 1, where a piezoelectric actuator of the plurality of piezoelectric actuators includes at least one electrode, and the piezoelectric actuator is affixed to the frame using a conductive adhesive providing an electrical path between the frame and the piezoelectric actuator.

13. The micromirror actuator assembly of claim 12, further comprising a non-conductive adhesive around the conductive adhesive to further affix the piezoelectric actuator to the frame and insulate the electrical path.

14. The micromirror actuator assembly of claim 1, where the frame includes a metal alloy that is expansion-matched to silicon.

15. The micromirror actuator assembly of claim 14, where the metal alloy is alloy 42.

16. The micromirror actuator assembly of claim 1, where the micromirror includes silicon.

17. The micromirror actuator assembly of claim 1, where each of the plurality of piezoelectric actuators include lead zirconate titanate (PZT).

18. A micromirror actuator assembly, comprising:
    a lower printed circuit board (PCB);
    an upper deformation-resistant supporting cover;
    a frame spaced away from the lower PCB and spaced away from the upper deformation-resistant supporting cover between the lower PCB and the upper deformation-resistant supporting cover;
    one or more lower spacers extending between the frame and the lower PCB and spacing the lower PCB away from the frame;
    a micromirror rotatably attached to the frame; and
    a plurality of piezoelectric actuators affixed to the frame and configured to selectively deform the frame to scan the micromirror.

19. A micromirror resonance actuator assembly, comprising:
    a lower printed circuit board (PCB);
    an upper deformation-resistant supporting cover including a light-admitting aperture;
    a frame spaced away from the lower PCB and spaced away from the upper deformation-resistant supporting cover between the lower PCB and the upper deformation-resistant supporting cover;
    one or more lower spacers extending between the frame and the lower PCB and spacing the lower PCB away from the frame;
    a micromirror rotatably attached to the frame; and
    a plurality of piezoelectric actuators affixed to the frame and configured to selectively deform the frame to scan the micromirror, such that light passing through the light-admitting aperture is selectively redirected by the micromirror back through the light-admitting aperture during scanning of the micromirror.

20. The micromirror actuator assembly of claim 1, wherein circuitry associated with operation of the micromirror is integrated into either or both of the upper PCB and lower PCB.

* * * * *